United States Patent
Chang

(10) Patent No.: US 11,979,998 B2
(45) Date of Patent: May 7, 2024

(54) DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Huanhuan Chang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 306 days.

(21) Appl. No.: 17/600,296

(22) PCT Filed: Jul. 13, 2021

(86) PCT No.: PCT/CN2021/105964
§ 371 (c)(1),
(2) Date: Sep. 30, 2021

(87) PCT Pub. No.: WO2022/262039
PCT Pub. Date: Dec. 22, 2022

(65) Prior Publication Data
US 2023/0301000 A1  Sep. 21, 2023

(30) Foreign Application Priority Data

Jun. 18, 2021 (CN) .......................... 202110675232.7

(51) Int. Cl.
*H05K 5/02* (2006.01)
(52) U.S. Cl.
CPC .................................. *H05K 5/0217* (2013.01)
(58) Field of Classification Search
CPC ............................. H05K 5/0217; G09F 9/301
See application file for complete search history.

(56) References Cited

U.S. PATENT DOCUMENTS 10,847,735 B2 *  11/2020  Seo ...................... H10K 77/111
11,237,596 B2 *   2/2022  Kim ......................... G09F 9/301
(Continued)

FOREIGN PATENT DOCUMENTS

| CN | 104900153 A | 9/2015 |
| CN | 205281990 U | 6/2016 |

(Continued)

OTHER PUBLICATIONS

PCT International Search Report for International Application No. PCT/CN2021/105964, dated Mar. 15, 2022, 8pp.

(Continued)

*Primary Examiner* — Anthony Q Edwards
*Assistant Examiner* — Hung Q Dang
(74) *Attorney, Agent, or Firm* — The Roy Gross Law Firm, LLC; Roy Gross

(57) ABSTRACT

A display device is provided, which has a display panel, a support portion, and a telescopic portion. The display panel has a bending portion for bending so as to fold the display panel inwardly or outwardly. The support portion supports and is connected to the display panel. The telescopic portion is at least disposed opposite to the bending portion, and at least one end of the telescopic portion extends to be movably connected with the support portion, such that a length of a part of the telescopic portion corresponding to the bending portion changes following a bending state of the bending portion.

20 Claims, 5 Drawing Sheets

(56) References Cited

U.S. PATENT DOCUMENTS

| | | | | |
|---|---|---|---|---|
| 11,341,873 B2* | 5/2022 | Chou | .................... | G06F 1/1652 |
| 2018/0242466 A1* | 8/2018 | Lee | .................... | G06F 1/1652 |
| 2018/0341293 A1* | 11/2018 | Kim | .................... | G06F 1/1641 |
| 2019/0073002 A1* | 3/2019 | Wu | .................... | G06F 1/1626 |
| 2020/0042042 A1* | 2/2020 | Park | .................... | H10K 77/111 |
| 2021/0027670 A1 | 1/2021 | Chou et al. | | |

FOREIGN PATENT DOCUMENTS

| | | | |
|---|---|---|---|
| CN | 107437378 | A | 12/2017 |
| CN | 108428408 | A | 8/2018 |
| CN | 207910845 | U | 9/2018 |
| CN | 208806015 | U | 4/2019 |
| CN | 110336904 | A | 10/2019 |
| CN | 110534025 | A | 12/2019 |
| CN | 210112063 | U | 2/2020 |
| CN | 111064833 | A | 4/2020 |
| CN | 210955910 | U | 7/2020 |
| CN | 112470203 | A | 3/2021 |
| CN | 112767843 | A | 5/2021 |

OTHER PUBLICATIONS

PCT Written Opinion of the International Searching Authority for International application No. PCT/CN2021/105964, dated Mar. 15, 2022, 10pp.

Chinese Office Action issued in corresponding Chinese Patent Application No. 202110675232.7 dated Jan. 21, 2022, pp. 1-10, 20pp.

Chinese Office Action issued in corresponding Chinese Patent Application No. 202110675232.7 dated Jul. 27, 2022, pp. 1-8, 19pp.

Chinese Decision of Rejection issued in corresponding Chinese Patent Application No. 202110675232.7 dated Jan. 19, 2023, pp. 1-7, 18pp.

Chinese Office Action issued in corresponding Chinese Patent Application No. 202110675232.7 dated Jun. 19, 2023, pp. 1-11, 24pp.

* cited by examiner

DISPLAY DEVICE

CROSS REFERENCE TO RELATED APPLICATIONS

This application is a National Phase of PCT Patent Application No. PCT/CN2021/105964 having International filing date of Jul. 13, 2021, which claims the benefit of priority of Chinese Application No. 202110675232.7 filed on Jun. 18, 2021. The contents of the above applications are all incorporated by reference as if fully set forth herein in their entirety.

FIELD OF DISCLOSURE

This application relates to a field of display technology, in particular to a field of display panel manufacturing technology, and in more particular to a display device.

BACKGROUND OF DISCLOSURE

As a kind of flexible screen, a flexible screen is based on the bendable characteristics of the flexible screen and realizes a folding function by bending at different angles.

A display screen of the flexible screen is supported by a support frame. A total length of the folding screen is inconsistent in a flat state and different bending states. However, a length of the support frame is fixed, which causes the display screen to receive greater force from the support frame in both the inwardly folded state and the outwardly folded state, which causes the display screen to break and reduces a life of the folding screen.

From above, it is necessary to provide a display device that can reduce a risk of breakage of the display screen and improve the life of the folding screen.

SUMMARY OF DISCLOSURE

An object of the present application is to provide a display device, which solves a technical problem that the existing support frame with a fixed length exerts too much force on the display screen when the display screen is folded inwardly and outwardly, which causes the display screen to break.

An embodiment of the present application provides a display device. The display device comprises:
  a display panel comprising a bending portion, wherein the bending portion is used to bend so as to fold the display panel inwardly or outwardly;
  a support portion supporting and connected to the display panel; and
  a telescopic portion at least disposed opposite to the bending portion, and
  at least one end of the telescopic portion extending to be movably connected with the support portion, wherein a length of a part of the telescopic portion corresponding to the bending portion changes following a bending state of the bending portion;
  wherein the support portion comprises:
    a first support portion, wherein a first end of the telescopic portion is fixedly connected or movably connected to the first support portion; and
    a second support portion, wherein the second support portion and the first support portion are arranged oppositely, and a second end of the telescopic portion is movably connected to the second support portion; and wherein the telescopic portion comprises:
    a plurality of support shafts, wherein at least one end of the telescopic portion in the support shafts extends to be movably connected with the support portion; and
    a plurality of rotating shafts arranged opposite to the bending portion, wherein two adjacent support shafts are movably connected by one of the rotating shafts.
  In an embodiment, the support portion comprises:
  a first support portion, wherein a first end of the telescopic portion is fixedly connected or movably connected to the first support portion; and
  a second support portion, wherein the second support portion and the first support portion are arranged oppositely, and a second end of the telescopic portion is movably connected to the second support portion.
  In an embodiment, the display device further comprises:
  a first adjusting portion, wherein the first adjusting portion and the support portion are arranged on a same layer, wherein the first adjusting portion is located on a side of the second support portion close to the first support portion and connected to the second support portion, wherein an end of the first adjusting portion close to the first support portion is fixedly connected to the telescopic portion, and the first adjusting portion is used to control a movement of the telescopic portion relative to the second support portion.
  In an embodiment, the first adjusting portion comprises:
  a connecting portion, wherein the connecting portion is fixedly connected to the telescopic portion; and
  an elastic portion, wherein the elastic portion is filled between the connecting portion and the second support portion;
    wherein a size of the elastic portion in a first direction changes following the bending state of a bending portion, so as to cooperate with a movement of the connecting portion relative to the first support portion and to control a movement of the telescopic portion relative to the second support portion, wherein the first direction may be the same as or opposite to a direction in which the second support portion points to the first support portion.
  In an embodiment, the first adjusting portion further comprises:
  a telescopic motor, wherein the telescopic motor is fixedly connected to the second support portion; and
  a telescopic rod, wherein a first end of the telescopic rod is fixedly connected to the connecting portion, and a second end of the telescopic rod is movably connected to the telescopic motor,
    wherein the telescopic motor controls a movement of the telescopic rod in the first direction to adjust the size of the elastic portion in the first direction.
  In an embodiment, the connecting portion and the telescopic portion are integrally formed.
  In an embodiment, the display device further comprises:
  a sensing portion, wherein the sensing portion is arranged on a side surface of the bending portion close to the telescopic portion, and two ends of the sensing portion respectively extend to or beyond the two ends of the bending portion, wherein the sensing portion is used for acquiring and transmitting a bending state information of the bending portion to the first adjusting portion.
  In an embodiment, the display device further comprises:
  a second regulating portion, wherein the second adjusting portion supports and is movably connected to the second end of the telescopic portion, and the telescopic portion moves relative to the second adjusting portion under a control of the first adjusting portion.

An embodiment of the present application provides a display device. The display device comprises:
- a display panel comprising a bending portion, wherein the bending portion is used to bend so as to fold the display panel inwardly or outwardly;
- a support portion supporting and connected to the display panel; and
- a telescopic portion at least disposed opposite to the bending portion, and at least one end of the telescopic portion extending to be movably connected with the support portion, wherein a length of a part of the telescopic portion corresponding to the bending portion changes following a bending state of the bending portion.

In an embodiment, the support portion comprises:
a first support portion, wherein a first end of the telescopic portion is fixedly connected or movably connected to the first support portion; and
a second support portion, wherein the second support portion and the first support portion are arranged oppositely, and a second end of the telescopic portion is movably connected to the second support portion.

In an embodiment, the display device further comprises:
a first adjusting portion, wherein the first adjusting portion and the support portion are arranged on a same layer, wherein the first adjusting portion is located on a side of the second support portion close to the first support portion and connected to the second support portion, wherein an end of the first adjusting portion close to the first support portion is fixedly connected to the telescopic portion, and the first adjusting portion is used to control a movement of the telescopic portion relative to the second support portion.

In an embodiment, the first adjusting portion comprises:
a connecting portion, wherein the connecting portion is fixedly connected to the telescopic portion; and
an elastic portion, wherein the elastic portion is filled between the connecting portion and the second support portion;
wherein a size of the elastic portion in a first direction changes following the bending state of a bending portion, so as to cooperate with a movement of the connecting portion relative to the first support portion and to control a movement of the telescopic portion relative to the second support portion, wherein the first direction may be the same as or opposite to a direction in which the second support portion points to the first support portion.

In an embodiment, the first adjusting portion further comprises:
a telescopic motor, wherein the telescopic motor is fixedly connected to the second support portion; and
a telescopic rod, wherein a first end of the telescopic rod is fixedly connected to the connecting portion, and a second end of the telescopic rod is movably connected to the telescopic motor,
wherein the telescopic motor controls a movement of the telescopic rod in the first direction to adjust the size of the elastic portion in the first direction.

In an embodiment, the connecting portion and the telescopic portion are integrally formed.

In an embodiment, the display device further comprises:
a sensing portion, wherein the sensing portion is arranged on a side surface of the bending portion close to the telescopic portion, and two ends of the sensing portion respectively extend to or beyond the two ends of the bending portion, wherein the sensing portion is used for acquiring and transmitting a bending state information of the bending portion to the first adjusting portion.

In an embodiment, the sensing portion is a pull cord sensor or a pull force sensor.

In an embodiment, a side of the first support portion close to the bending portion is recessed to form a first opening, and a side of the connecting portion close to the bending portion is recessed to form a second opening, wherein the first opening and the second opening are arranged opposite to each other,
wherein two ends of a sensing portion respectively extend beyond two ends of the bending portion, and the two ends of the sensing portion respectively extend into the first opening and the second opening.

In an embodiment, the display device further comprises:
a second regulating portion, wherein the second adjusting portion supports and is movably connected to a second end of the telescopic portion, and the telescopic portion moves relative to the second adjusting portion under a control of the first adjusting portion.

In an embodiment, the second adjusting portion comprises:
a guide shaft, wherein a second end of the telescopic portion comprises an inclined surface area, the inclined surface area is movably connected to the guide shaft, and the inclined surface area is used to rotate the telescopic portion around the guide shaft.

In an embodiment, the telescopic portion comprises:
a plurality of support shafts, wherein at least one end of the telescopic portion in the support shafts extends to be movably connected with the support portion; and
a plurality of rotating shafts arranged opposite to the bending portion, wherein two adjacent support shafts are movably connected by one of the rotating shafts.

In an embodiment, the display device further comprises:
an adhesive layer provided between an edge area of a bottom of the display panel and the support portion, wherein the adhesive layer is used to fix the display panel and the support portion.

The present application provides a display device comprising: a display panel comprising a bending portion, wherein the bending portion is used to bend so as to fold the display panel inwardly or outwardly; a support portion supporting and connected to the display panel; and a telescopic portion at least disposed opposite to the bending portion, and at least one end of the telescopic portion extending to be movably connected with the support portion, wherein a length of a part of the telescopic portion corresponding to the bending portion changes following a bending state of the bending portion. In this application, by setting at least one end of the telescopic portion to extend to be movably connected to the support portion, the length of the part of the telescopic portion corresponding to the bending portion changes following the bending state of the bending portion. That is, when the display panel is folded inwardly or outwardly, the length of the part of the telescopic portion corresponding to the bending portion will change accordingly. It is avoided that the length of the part of the telescopic portion corresponding to the bending portion is too short or too long, and the force of the telescopic portion on the display panel is too large. The risk of breakage of the display panel is reduced, thereby increasing the life span of the display device.

DESCRIPTION OF DRAWINGS

The technical solutions and other beneficial effects of the present application will be made obvious by describing the specific implementation manners of the present application in detail below in conjunction with the accompanying drawings.

DETAILED DESCRIPTION OF PREFERRED EMBODIMENTS

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application. Mentioning "embodiments" herein means that a specific feature, structure, or characteristic described in conjunction with the embodiments may be included in at least one embodiment of the present application. The appearance of the phrase in various places in the specification does not necessarily refer to the same embodiment, nor is it an independent or alternative embodiment mutually exclusive with other embodiments. Those skilled in the art clearly and implicitly understand that the embodiments described herein can be combined with other embodiments. In addition, it should be noted that the drawings only provide structures that are closely related to the application, and some details that are not relevant to the application are omitted. The purpose is to simplify the drawings so that the application points are clear at a glance, instead of showing that the actual device is exactly the same as the drawings, and is not a limitation of the actual device.

The present application provides a display device, and the display device includes but is not limited to the following embodiments and a combination of the following embodiments.

Figure 1:
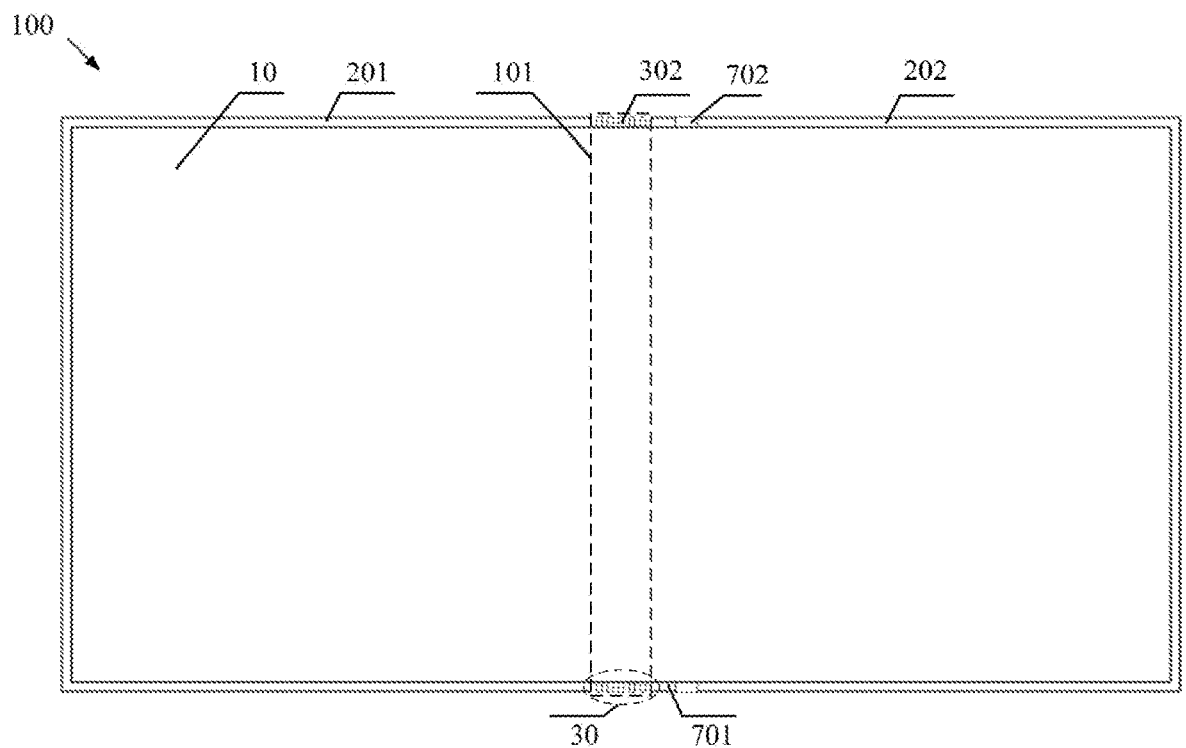
FIG. 1 is a schematic top view of a display device provided by an embodiment of the application.
Figure 2:
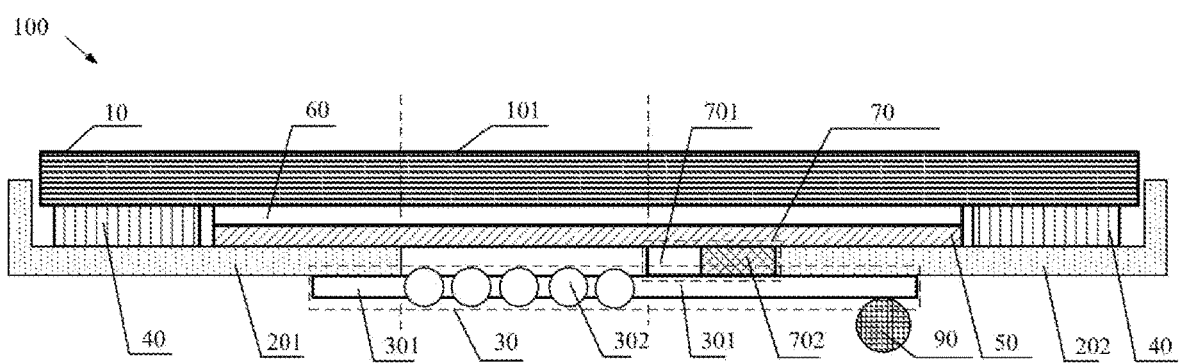
FIG. 2 is a schematic cross-sectional view of a display device provided by an embodiment of the application.

In an embodiment, as shown in FIGS. 1 and 2, the display device 100 includes: a display panel 10, wherein the display panel 10 includes a bending portion 101, and the bending portion 101 is used to bend so that the display panel 10 is folded inwardly or outwardly; a support portion, wherein the support portion supports and is connected to the display panel 10; and a telescopic portion 30, wherein the telescopic portion 30 is at least disposed opposite to the bending portion 101, and at least one end of the telescopic portion 30 extends to be movably connected to the support portion, wherein a length of the part of the telescopic portion 30 corresponding to the bending portion 101 changes following the bending state of the bending portion 101.

As shown in FIG. 1 and FIG. 2, the bending portion 101 may but is not limited to be located in a middle area of the display panel 10. It should be noted that if a length of a part of the telescopic portion 30 corresponding to the bending portion 101 is fixed, then when the display panel 10 is folded inwardly, the length of the telescopic portion 30 is too short. The movable area provided by the telescopic portion 30 for the bending portion 101 is too small. The greater the force of the telescopic portion 30 on the bending portion 101 is, the easier it is to cause the display panel 10 to break. Similarly, when the display panel 10 is folded outwardly, the length of the telescopic portion 30 is too long, and the telescopic portion 30 is stacked under the bending portion 101. The greater the force of the telescopic portion 30 on the bending portion 101 is, the more likely it is to cause the display panel 10 to break.

It is understandable that in the present application, by extending at least one end of the telescopic portion 30 to be movably connected to the support portion. That is, the telescopic portion 30 can be moved relative to the support portion to change the length of the part of the telescopic portion 30 corresponding to the bending portion 101. Further, the length of the part of the telescopic portion 30 corresponding to the bending portion 101 changes following the bending state of the bending portion 101. In combination with the technical problem, that is, when the display panel 10 is folded inwardly, the length of the part of the telescopic portion 30 corresponding to the bending portion 101 can be adjusted to be greater than the standard length. When the display panel 10 is folded outwardly, the length of the part of the telescopic portion 30 corresponding to the bending portion 101 can be adjusted to be smaller than the standard length. The standard length may be the length of the part of the telescopic portion 30 corresponding to the bending portion 101 when the display panel is flattened.

In an embodiment, as shown in FIGS. 1 and 2, the support portion includes: a first support portion 201, wherein a first end of the telescopic portion 30 is fixedly connected or movably connected to the first support portion 201; and a second support portion 202, wherein the second support portion 202 is arranged opposite to the first support portion 201, and the second end of the telescopic portion 30 is movably connected to the second support portion 202. The first support portion 201 and the second support portion 202 may respectively extend from a bottom of the display panel 10 to the side of the display panel 10 to accommodate the display panel 10. Further, there is a gap between the support portion and a side portion of the display panel 10 to prevent the display panel from being scratched.

As shown in FIG. 2, an adhesive layer 40 is provided between an edge area of a bottom of the display panel 10 and the support portion. The adhesive layer 40 is used to fix the display panel 10 and the support portion. The adhesive layer 40 may be, but is not limited to, a fixing tape. Further, the display device 100 further includes a protective layer, The protective layer is located between a middle area of a bottom of the display panel 10 and the support portion, and the protective layer and the adhesive layer 40 are arranged in the same layer. That is, an upper surface and a lower surface of a protective layer and the adhesive layer 40 may be attached to the display panel 10 and the support portion respectively to improve a flatness of the display panel 10. There may be a gap between the protective layer and the adhesive layer 40. Specifically, the protective layer may include a sealing layer 50 and a first buffer layer 60 on the sealing layer 50. The sealing layer 50 is used to block external water vapor and foreign matter from entering the display panel 10. The sealing layer 50 can be, but not limited to, a sealing tape. The first buffer layer 60 is used to buffer external impact, and the first buffer layer 60 may be, but is not limited to, foam tape.

It is understandable that in the present application, a second end of the telescopic portion 30 is movably connected to the second support portion 202. That is, the telescopic portion 30 can move relative to the second support portion 202. That is, the telescopic portion 30 can move in the first direction. The first direction may be the same as or opposite to the direction in which the second support portion 202 points to the first support portion 201. When the first end of the telescopic portion 30 is fixedly connected to the first support portion 201, the second end of the telescopic portion 30 can be controlled to move in the first direction to adjust the length of the part of the telescopic portion 30 corresponding to the bending portion 101. When the first end of the telescopic portion 30 is movably connected with the first support portion 201, a difference in speed between the first end and the second end of the telescopic portion 30 moving in the first direction can be controlled to adjust the length of the part of the telescopic portion 30 corresponding to the bending portion 101.

In an embodiment, as shown in FIG. 2, the display device further comprises: a first adjusting portion 70, wherein the first adjusting portion 70 and the support portion are provided on a same layer. The first adjusting portion 70 is located on a side of the second support portion 202 close to the first support portion 201 and connected to the second support portion 202. One end of the first adjusting portion 70 close to the first support portion 201 is fixedly connected to the telescopic portion 30, and the first adjusting portion 70 is used to control a movement of the telescopic portion 30 relative to the second support portion 202.

It is noted that, the second support portion 202 is fixedly connected to the display panel 10, and the first adjusting portion 70 is connected to the second support portion 202. Therefore, one end of the first adjusting portion 70 can be fixed relative to the display panel 10. Further, in the present application, an end of the first adjusting portion 70 close to the first support portion 201 is fixedly connected to the telescopic portion 30. When the end of the first adjusting portion 70 close to the first support portion 201 moves in the first direction, the telescopic portion 30 can follow a movement of the first adjusting portion 70 to move to adjust the telescopic portion 30 is the length of the part corresponding to the bending portion 101.

In an embodiment, as shown in FIGS. 1 and 2, the first adjusting portion 70 includes: a connecting portion 701, wherein the connecting portion 701 is fixedly connected to the telescopic portion 30; and an elastic portion 702, wherein the elastic portion 702 is filled between the connecting portion 701 and the second support portion 202. A size of the elastic portion 702 in the first direction changes following the bending state of the bending portion 101, so as to cooperate with the movement of the connecting portion 701 relative to the first support portion 201 and to control the movement of the telescopic portion 30 relative to the second support portion 202.

The elastic portion 702 has elasticity. The elastic portion 702 can be, but not limited to, a stretchable tape. A constituent material of the connecting portion 701 may be a rigid material. That is, a shape of the connecting portion 701 may remain unchanged when the display panel 10 is folded inwardly or outwardly. It is understandable that in this application, the elastic portion 702 is filled between the connecting portion 701 and the second support portion 202. When the display panel 10 is folded inwardly or outwardly, the connecting portion 701 connected to the elastic portion 702 moves in the first direction under a cooperation of the size change of the elastic portion 702 in the first direction. Further, the connecting portion 701 is fixedly connected to the telescopic portion 30. That is, the telescopic portion 30 can also move in the first direction following the connecting portion 701 to adjust the length of the part of the telescopic portion 30 corresponding to the bending portion 101.

The connecting portion 701 and the telescopic portion 30 are integrally formed. It can be understood that since the connecting portion 701 is fixedly connected to the telescopic portion 30, the direction and speed of the movement of the two remain the same. In the present application, the connecting portion 701 and the telescopic portion 30 are integrally formed, which can further improve the consistency of movement of the telescopic portion 30 and the connecting portion 701. The accuracy of adjusting the length of the part of the telescopic portion 30 corresponding to the bending portion 101 is improved.

Figure 3:
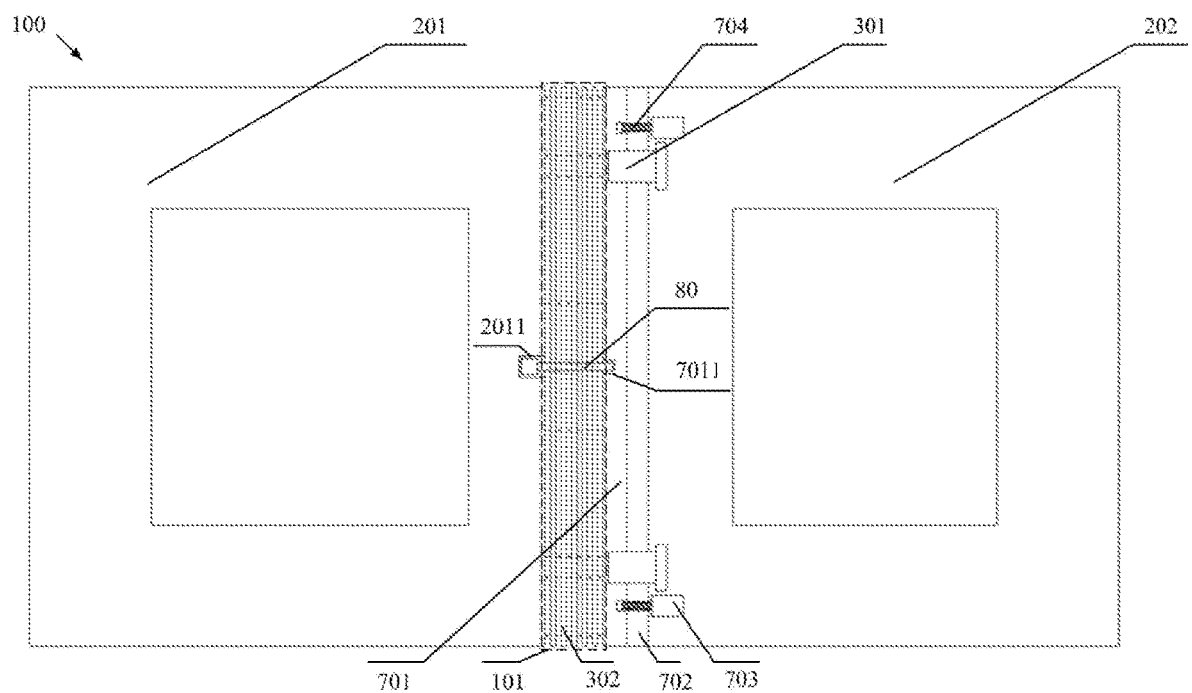
FIG. 3 is a schematic bottom view of a display device provided by an embodiment of the application.

In one embodiment, as shown in FIG. 3, the first adjusting portion 70 further includes: a telescopic motor 703, wherein the telescopic motor 703 is fixedly connected to the second support portion 202; and a telescopic rod 704, wherein a first end of the telescopic rod 704 is fixedly connected to the connecting portion 701, and a second end of the telescopic rod 704 is movably connected to the telescopic motor 703. The telescopic motor 703 controls the telescopic rod 704 to move in the first direction to adjust a size of the elastic portion 702 in the first direction.

Specifically, the telescopic motor 703 may be fixedly arranged on a side of the second support portion 202 away from the display panel 10 to be fixed on the second support portion 202. The first end of the telescopic rod 704 may be fixedly arranged on a side of the connecting portion 701 away from the display panel 10 to be fixed on the connecting portion 701. The second end of the telescopic rod 704 may be screwed to the telescopic motor 703. Understandable, when the display panel 10 is folded inwardly or outwardly, the telescopic motor 703 can extend or retract the telescopic rod 704 into a corresponding size according to the bending state of the display panel 10. Correspondingly, the connecting portion 701 fixedly connected to the telescopic rod 704 also moves in the first direction under the cooperation of the elastic portion 702. The telescopic portion 30 can also move in the first direction following the connecting portion 701 to adjust the length of the part of the telescopic portion 30 corresponding to the bending portion 101. Further, the telescopic rod 704 may include a spring arranged on a periphery. When the telescopic motor 703 extends or retracts the telescopic rod 704 into a corresponding size, the spring can assist the telescopic rod 704 to move away from or close to the telescopic motor 703.

Figure 5:
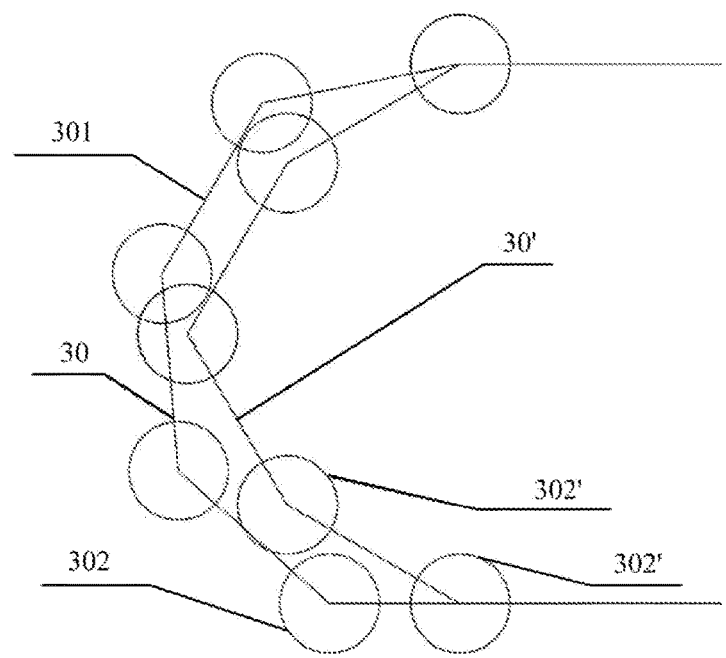
FIG. 5 is a schematic diagram of an inwardly folded state of a telescopic portion provided by an embodiment of the application.
Figure 6:
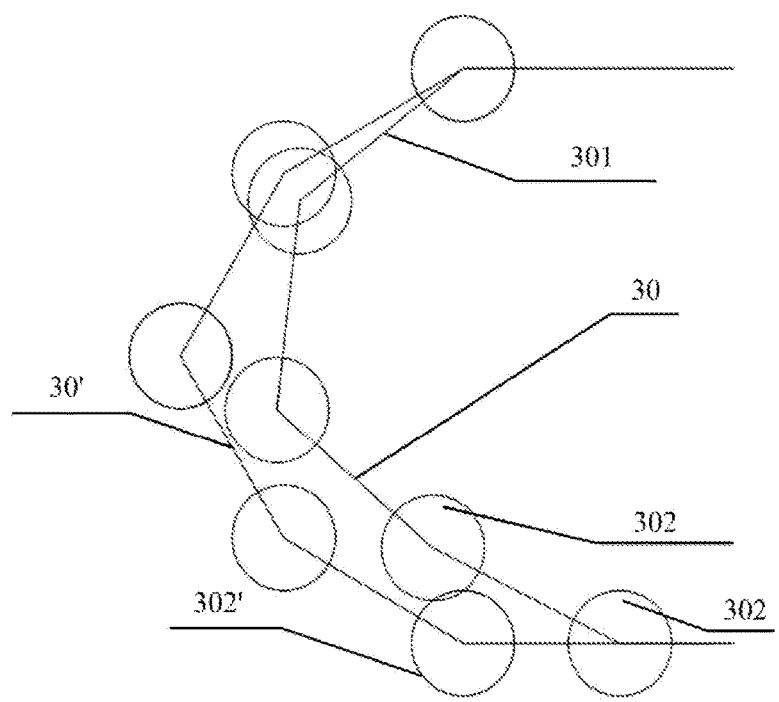
FIG. 6 is a schematic diagram of an outwardly folded state of a telescopic portion provided by an embodiment of the application.

In one embodiment, as shown in FIG. 2, the telescopic portion 30 includes: a plurality of support shafts 301, wherein
at least one end of the telescopic portion 30 in the support shafts 301 extends to be movably connected with the support portion; and a plurality of rotating shafts 302. As shown in FIGS. 1 to 3, a plurality of the rotating shafts 302 are arranged opposite to the bending portion 101. As shown in FIG. 2, two adjacent support shafts 301 move through a rotating shaft 302 connect with each other. It can be understood that the telescopic portion 30 is located on the side of the support portion away from the display panel 10, so the telescopic portion 30 has a supporting effect on the support portion and the display panel 10. The constituent material of the telescopic portion 30 may be a rigid material. However, when the bending portion 101 is bent, the telescopic portion 30 disposed opposite to the bending portion 101 will also be bent together with the bending portion 101 to assist the bending of the bending portion 101. Therefore, in the present application, the telescopic portion 30 is configured to include a plurality of the rotating shafts 302 and a plurality of the support shafts 301 connecting the plurality of rotating shafts 302. It is understandable that, as shown in FIG. 5 and FIG. 6, the two support shafts 301 on both sides of each rotating shaft 302 can rotate around the rotating shaft 302 to realize the bending movement of the telescopic portion 30 and further assist the bending of the bending portion 101.

In one embodiment, as shown in FIG. 2, the display device 100 further includes: a second adjusting portion 90, wherein the second adjusting portion 90 is supported and movably connected to the second end of the telescopic portion 30, and the telescopic portion 30 moves relative to the second adjusting portion 90 under the control of the first adjusting portion 70. It can be understood that when the telescopic portion 30 moves in the first direction following the connecting portion 701, the second adjusting portion 90 supports the telescopic portion 30 and is movably connected to the second end of the telescopic portion 30 to assist the telescopic portion 30 to move in the first direction.

Figure 7:
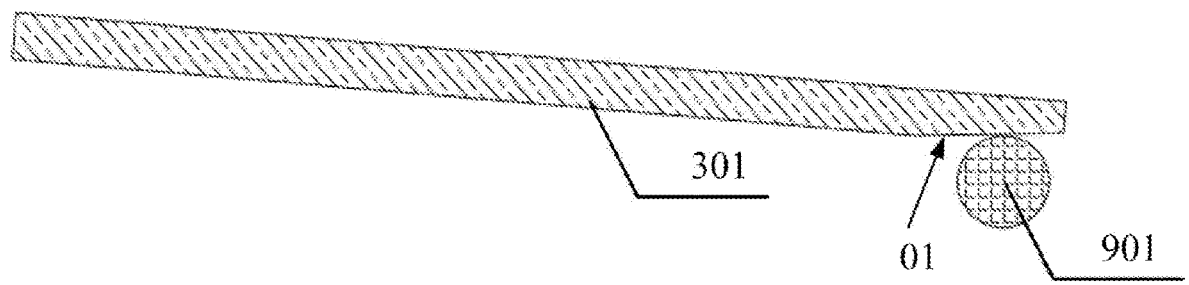
FIG. 7 is a schematic diagram of an inwardly folded state of the telescopic portion and a second adjusting portion provided by an embodiment of the application.

In an embodiment, as shown in FIG. 7, the second adjusting portion 90 includes a guide shaft 901, and a second end of the telescopic portion 30 includes an inclined surface area 01. The inclined surface area 01 is movably connected to the guide shaft 901, and the inclined surface area 01 is used to rotate the telescopic portion 30 around the guide shaft 901. Specifically, the inclined surface area 01 may be included in the support shaft 301 close to the guide shaft 901 in the telescopic portion 30, and an angle between the inclined surface area 01 and a bottom surface of the support shaft 301 may be an obtuse angle. When the display panel 10 is folded inwardly, it can be seen in conjunction with FIG. 2 and FIG. 7 that the two ends of the telescopic portion 30 are located above the middle area of the telescopic portion 30. At this time, the inclined surface area 01 assists the telescopic portion 30 to achieve inwardly folding. Further, the inclined surface area 01 should enable the maximum inwardly folding degree of the telescopic portion 30 to be equivalent to the maximum inwardly folding degree of the display panel 10. Further, when the telescopic portion 30 is in a flattened state, the inclined surface area 01 and the guide shaft 901 may still have an intersection.

In one embodiment, as shown in FIG. 3, the display device 100 further includes: a sensing portion 80. The sensing portion 80 is arranged on a side surface of the bending portion 101 close to the telescopic portion 30. Further, two ends of the sensing portion 80 respectively extend to or beyond the two ends of the bending portion 101. The sensing portion 80 is used for acquiring and transmitting the bending state information of the bending portion 101 to the first adjusting portion 70. The sensing portion 80 may be, but not limited to, a pull cord sensor or a pull force sensor. Further, the pull cord sensor may be a pull cord displacement sensor, and the pull force sensor may be a resistive strain sensor.

Specifically, when the sensing portion 80 is a pull cord displacement sensor, the sensing portion 80 and the bottom surface of the bending portion 101 may have a height difference. When the bending portion 101 is bent, a bending radius of the bending portion 101 and the bending radius of the sensing portion 80 are not consistent. Therefore, the arc length corresponding to the bending portion 101 is not consistent with the arc length corresponding to the sensing portion 80. The sensing portion 80 can obtain the corresponding arc length difference value as the bending state information of the bending portion 101. Further, the first adjusting portion 70 can adjust the telescopic portion 30 according to the bending state information of the bending portion 101.

Specifically, when the sensing portion 80 is a resistive strain sensor, a resistance value of the sensing portion 80 will correspondingly change with the bending state of the bending portion 101. The sensing portion 80 may be attached to the bottom surface of the bending portion 101. When the bending portion 101 is bent, the shape of the sensing portion 80 also changes accordingly. Therefore, the resistance value of the sensing portion 80 changes, and there is a resistance difference between the resistance value of the sensing portion 80 when the bending portion 101 is flattened. The sensing portion 80 may obtain the corresponding resistance difference as the bending state information of the bending portion 101. Further, the first adjusting portion 70 can adjust the telescopic portion 30 according to the bending state information of the bending portion 101.

Figure 4:
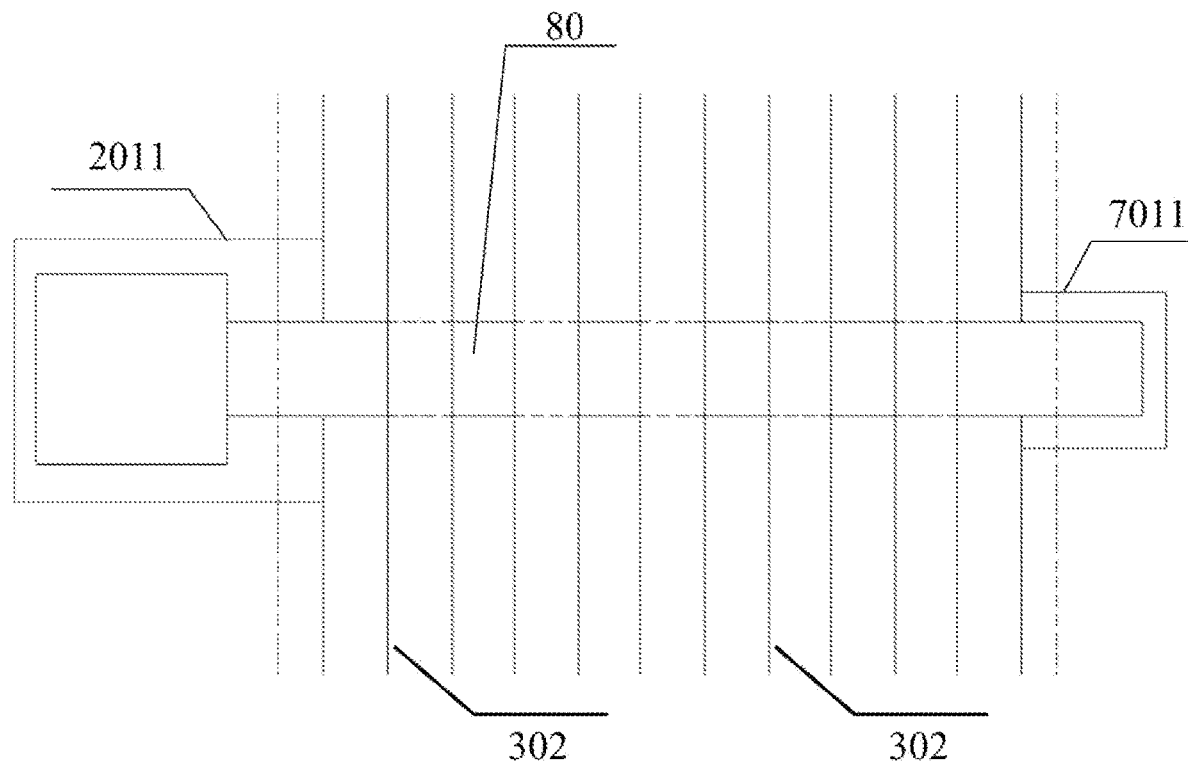
FIG. 4 is a schematic diagram of a sensing portion and related components provided by an embodiment of the application.

Further, as shown in FIG. 4, a first opening 2011 may be formed concavely on a side of the first support portion 201 close to the bending portion 101. A second opening 7011 may be concavely formed on a side of the connecting portion 701 close to the bending portion 101. The first opening 2011 and the second opening 7011 are arranged opposite to each other. When the two ends of the sensing portion 80 respectively extend beyond the two ends of the bending portion 101, the two ends of the sensing portion 80 may respectively extend into the first opening 2011 and the second opening 7011. It is understandable that this can ensure that the sensing portion 80 completely covers the bending portion 101 in the first direction, so as to improve the reliability of the sensing portion 80 in operation.

Specifically, as shown in FIGS. 5 to 6, the bending forms of the telescopic portion 30' in the prior art and the telescopic portion 30 in the present application are respectively shown in the inwardly folded state and the outwardly folded state of the bending portion 101. In combination with the above discussion, it can be seen that during the inwardly folding process of the display panel 10, the first adjusting portion 70 can obtain the inwardly folding degree of the display panel 10 through the sensing portion 80. The first adjusting portion 70 can control the telescopic portion 30 to move a corresponding distance away from the second support portion 202, As shown in FIG. 5, in the telescopic portion 30 in the present application, compared to the telescopic portion 30' in the prior art, the length of the part corresponding to the bending portion 101 is larger. The movable range of the bending portion 101 can be increased, and the compression on the bending portion 101 can be reduced. Similarly, during the outwardly folding process of the display panel 10, the first adjusting portion 70 can obtain the outwardly folding degree of the display panel 10 through the sensing portion 80. The first adjusting portion 70 can control the telescopic portion 30 to move a corresponding distance in the direction close to the second support portion 202. As shown in FIG. 6, in the telescopic portion 30 in the present application, compared to the telescopic portion 30' in the prior art, the length of the part corresponding to the bending portion 101 is smaller. It is possible to reduce the length of the expansion and contraction portion 30 accumulated on a back of the bending portion 101, and to reduce the pressing on the bending portion 101.

Specifically, the first end of the telescopic portion 30 and the first support portion 201 are fixedly connected as an example for description. A position of the rotating shaft 302 of the telescopic portion 30 close to the first support portion 201 can be approximately regarded as being fixed relative to the first support portion 201. As shown in FIG. 5, during the folding process of the display panel 10, compared with the rotating shaft 302' close to the first adjusting portion 70 of the telescopic portion 30' in the prior art, the rotating shaft 302 close to the first adjusting portion 70 of the telescopic portion 30 in the present application moves in a direction away from the first adjusting portion 70, so as to increase the length of the part of the telescopic portion 30 corresponding to the bending portion 101. As shown in FIG. 6, during the outwardly folding process of the display panel 10, compared with the rotating shaft 302' close to the first adjusting portion 70 of the telescopic portion 30' in the prior art, the rotating shaft 302 close to the first adjusting portion 70 of the telescopic portion 30 in the present application moves in a direction close to the first adjusting portion 70, so as to reduce the length of the part of the telescopic portion 30 corresponding to the bending portion 101.

Figure 8:
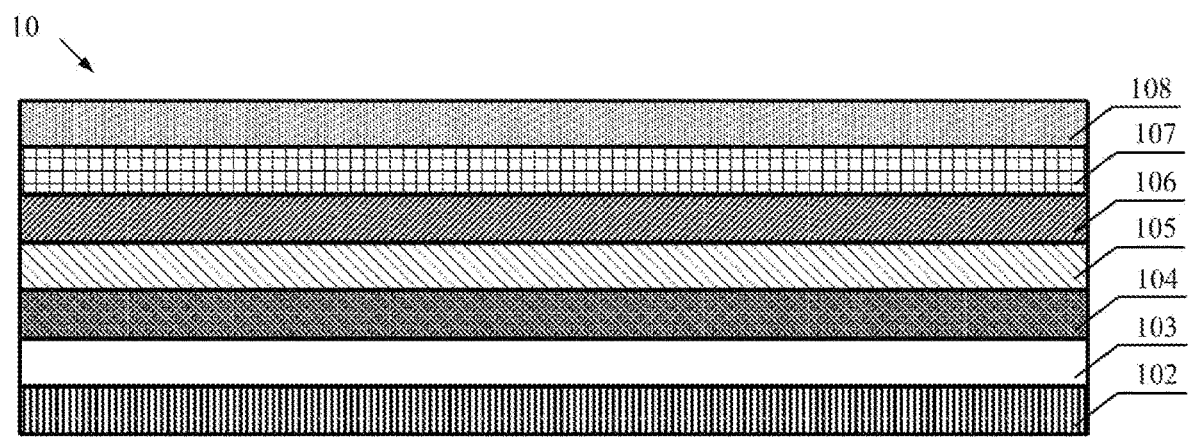
FIG. 8 is a schematic cross-sectional view of a display panel provided by an embodiment of the application.

The display panel 10 may be, but is not limited to, an OLED (organic light-emitting diode, organic light-emitting semiconductor) display panel. Specifically, as shown in FIG. 8, the display panel 10 may include: a support layer 102; a second buffer layer 103 on the support layer 102; a substrate layer 104 on the second buffer layer 103; a display layer 105 located on the substrate layer 104; a polarizing layer 106 located on the display layer 105; a adhesive layer 107 located on the polarizing layer 106; and a cover layer 108 located on the adhesive layer 107. Specifically, a part of the support layer 102 including the bending portion 101 is provided with at least one opening to realize the bending function of the bending portion 101. The second buffer layer 103 is used to buffer external pressure on the display panel 10 and to fix the second buffer layer 103 and the substrate layer 104. The constituent material of the second buffer layer 103 may include foam. The constituent material of the substrate layer 104 may include polyimide. The display layer 105 may include a circuit layer and a plurality of light emitting devices located on the circuit layer. The adhesive layer 107 is used to fix the cover layer 108 on the polarizing layer 106, and the constituent material of the adhesive layer 107 may include transparent optical adhesive.

The present application provides a display device comprising: a display panel comprising a bending portion, wherein the bending portion is used to bend so as to fold the display panel inwardly or outwardly; a support portion support and connected to the display panel; and a telescopic portion at least disposed opposite to the bending portion, and at least one end of the telescopic portion extending to be movably connected with the support portion, wherein a length of a part of the telescopic portion corresponding to the bending portion changes following a bending state of the bending portion. In this application, by setting at least one end of the telescopic portion to extend to be movably connected to the support portion, the length of the part of the telescopic portion corresponding to the bending portion changes following the bending state of the bending portion. That is, when the display panel is folded inwardly or outwardly, the length of the part of the telescopic portion corresponding to the bending portion will change accordingly. It is avoided that the length of the part of the telescopic portion corresponding to the bending portion is too short or too long, and the force of the telescopic portion on the display panel is too large. The risk of breakage of the display panel is reduced, thereby increasing the life span of the display device.

The display device provided by the embodiment of the present application is described in detail above. In this article, specific examples are used to explain the principles and implementation of this application. The descriptions of the above embodiments are only used to help understand the technical solutions and core ideas of this application. Those of ordinary skill in the art should understand that: they can still modify the technical solutions described in the foregoing embodiments, or equivalently replace some of the technical features. However, these modifications or replacements do not cause the essence of the corresponding technical solutions to deviate from the scope of the technical solutions of the embodiments of the present application.

The invention claimed is:

1. A display device, comprising:
   a display panel, comprising a bending portion, wherein the bending portion is used to bend so as to fold the display panel inwardly or outwardly;
   a support portion, supporting and connected to the display panel, and comprising:
     a first support portion; and
     a second support portion, arranged opposite to the first support portion;
   a foldable portion, at least disposed opposite to the bending portion, a length of a part of the foldable portion corresponding to the bending portion changing following a bending state of the bending portion, and comprising:
     a first end, fixedly connected or movably connected to the first support portion; and
     a second end, movably connected to the second support portion;
   a first adjusting portion, arranged on a same layer as the support portion, located on a side of the second support portion close to the first support portion, and connected to the second support portion, wherein an end of the first adjusting portion close to the first support portion is fixedly connected to the foldable portion, and the first adjusting portion is configured to control a movement of the foldable portion relative to the second support portion; and
   a sensing portion, arranged on a side surface of the bending portion close to the foldable portion, wherein two ends of the sensing portion respectively extend to or beyond two ends of the bending portion, and the sensing portion is configured to acquire and transmit a bending state information of the bending portion to the first adjusting portion.

2. The display device according to claim 1, wherein the first adjusting portion comprises:
   a connecting portion, fixedly connected to the foldable portion; and
   an elastic portion, filled between the connecting portion and the second support portion;
   wherein a size of the elastic portion in a first direction changes following the bending state of the bending portion, so as to cooperate with a movement of the connecting portion relative to the first support portion and to control a movement of the foldable portion relative to the second support portion, and the first direction is the same as or opposite to a direction in which the second support portion points to the first support portion.

3. The display device according to claim 2, wherein the first adjusting portion further comprises:
a telescopic motor, fixedly connected to the second support portion; and
a telescopic rod, comprising:
a first end, fixedly connected to the connecting portion; and
a second end, movably connected to the telescopic motor,
wherein the telescopic motor controls a movement of the telescopic rod in the first direction to adjust the size of the elastic portion in the first direction.

4. The display device according to claim 2, wherein the connecting portion and the foldable portion are integrally formed.

5. The display device according to claim 1, wherein the sensing portion is a pull cord sensor or a pull force sensor.

6. The display device according to claim 1, wherein a side of the first support portion close to the bending portion is recessed to form a first opening, a side of the connecting portion close to the bending portion is recessed to form a second opening, the first opening and the second opening are arranged opposite to each other, the two ends of the sensing portion respectively extend beyond the two ends of the bending portion, and the two ends of the sensing portion respectively extend into the first opening and the second opening.

7. The display device according to claim 1, wherein the display device further comprises:
a second adjusting portion, supporting and movably connected to the second end of the foldable portion, and the foldable portion moves relative to the second adjusting portion under a control of the first adjusting portion.

8. The display device according to claim 7, wherein the second adjusting portion comprises:
a guide shaft, wherein the second end of the foldable portion comprises an inclined surface area movably connected to the guide shaft, and the inclined surface area is configured to rotate the foldable portion around the guide shaft.

9. The display device according to claim 1, wherein the foldable portion comprises:
a plurality of support shafts; and
a plurality of rotating shafts, arranged opposite to the bending portion,
wherein each of the support shafts located on at least one end of the foldable portion extends to be movably connected with the support portion, and two adjacent ones of the support shafts are movably connected by one of the rotating shafts.

10. The display device according to claim 1, wherein the display device further comprises:
an adhesive layer provided between an edge area of a bottom of the display panel and the support portion, wherein the adhesive layer is used to fix the display panel and the support portion.

11. A display device, comprising:
a display panel, comprising a bending portion, wherein the bending portion is used to bend so as to fold the display panel inwardly or outwardly;
a support portion, supporting and connected to the display panel, and comprising:
a first support portion; and
a second support portion, arranged opposite to the first support portion;
a foldable portion, at least disposed opposite to the bending portion, a length of a part of the foldable portion corresponding to the bending portion changing following a bending state of the bending portion, and comprising:
a first end, fixedly connected or movably connected to the first support portion; and
a second end, movably connected to the second support portion; and
a first adjusting portion, arranged on a same layer as the support portion, located on a side of the second support portion close to the first support portion, and connected to the second support portion, an end of the first adjusting portion close to the first support portion being fixedly connected to the foldable portion, configured to control a movement of the foldable portion relative to the second support portion, and comprising:
a connecting portion, fixedly connected to the foldable portion;
an elastic portion, filled between the connecting portion and the second support portion;
a telescopic rod, comprising a first end fixedly connected to the connecting portion and a second end; and
a telescopic motor, fixedly connected to the second support portion, movably connected to the second end of the telescopic rod, and configured to control a movement of the telescopic rod in the first direction to adjust the size of the elastic portion in a first direction,
wherein a size of the elastic portion in the first direction changes following the bending state of the bending portion, so as to cooperate with a movement of the connecting portion relative to the first support portion and to control a movement of the foldable portion relative to the second support portion, and the first direction is the same as or opposite to a direction in which the second support portion points to the first support portion.

12. The display device according to claim 11, wherein the connecting portion and the foldable portion are integrally formed.

13. The display device according to claim 11, wherein the display device further comprises:
a second adjusting portion, supporting and movably connected to the second end of the foldable portion, and the foldable portion moves relative to the second adjusting portion under a control of the first adjusting portion.

14. The display device according to claim 13, wherein the second adjusting portion comprises:
a guide shaft, wherein the second end of the foldable portion comprises an inclined surface area-movably connected to the guide shaft, and the inclined surface area is configured to rotate the foldable portion around the guide shaft.

15. The display device according to claim 11, wherein the foldable portion comprises:
a plurality of support shafts; and
a plurality of rotating shafts, arranged opposite to the bending portion,
wherein each of the support shafts located on at least one end of the foldable portion extends to be movably connected with the support portion, and two adjacent ones of the support shafts are movably connected by one of the rotating shafts.

16. The display device according to claim 11, wherein the display device further comprises:
an adhesive layer provided between an edge area of a bottom of the display panel and the support portion, wherein the adhesive layer is used to fix the display panel and the support portion.

17. A display device, comprising:
a display panel, comprising a bending portion, wherein the bending portion is used to bend so as to fold the display panel inwardly or outwardly;
a support portion, supporting and connected to the display panel, and comprising:
a first support portion; and
a second support portion, arranged opposite to the first support portion;
a foldable portion, at least disposed opposite to the bending portion, a length of a part of the foldable portion corresponding to the bending portion changing following a bending state of the bending portion, and comprising:
a first end, fixedly connected or movably connected to the first support portion; and
a second end, movably connected to the second support portion;
a first adjusting portion, arranged on a same layer as the support portion, located on a side of the second support portion close to the first support portion, and connected to the second support portion, wherein an end of the first adjusting portion close to the first support portion is fixedly connected to the foldable portion, and the first adjusting portion is configured to control a movement of the foldable portion relative to the second support portion; and
a second adjusting portion, supporting and movably connected to the second end of the foldable portion, and comprising a guide shaft, wherein the foldable portion is configured to move relative to the second adjusting portion under a control of the first adjusting portion, the second end of the foldable portion comprises an inclined surface area movably connected to the guide shaft, and the inclined surface area is configured to rotate the foldable portion around the guide shaft.

18. The display device according to claim 17, wherein the first adjusting portion comprises:
a connecting portion, fixedly connected to the foldable portion; and
an elastic portion, filled between the connecting portion and the second support portion;
wherein a size of the elastic portion in a first direction changes following the bending state of the bending portion, so as to cooperate with a movement of the connecting portion relative to the first support portion and to control a movement of the foldable portion relative to the second support portion, and the first direction is the same as or opposite to a direction in which the second support portion points to the first support portion.

19. The display device according to claim 17, wherein the foldable portion comprises:
a plurality of support shafts; and
a plurality of rotating shafts, arranged opposite to the bending portion,
wherein each of the support shafts located on at least one end of the foldable portion extends to be movably connected with the support portion, and two adjacent ones of the support shafts are movably connected by one of the rotating shafts.

20. The display device according to claim 17, wherein the display device further comprises:
an adhesive layer provided between an edge area of a bottom of the display panel and the support portion, wherein the adhesive layer is used to fix the display panel and the support portion.

* * * * *